United States Patent
Gauger, Jr.

(10) Patent No.: US 8,964,997 B2
(45) Date of Patent: Feb. 24, 2015

(54) ADAPTED AUDIO MASKING

(75) Inventor: Daniel M. Gauger, Jr., Cambridge, MA (US)

(73) Assignee: Bose Corporation, Framingham, MA (US)

(*) Notice: Subject to any disclaimer, the term of this patent is extended or adjusted under 35 U.S.C. 154(b) by 943 days.

(21) Appl. No.: 13/117,250

(22) Filed: May 27, 2011

(65) Prior Publication Data

US 2011/0235813 A1 Sep. 29, 2011

Related U.S. Application Data

(63) Continuation-in-part of application No. 11/131,913, filed on May 18, 2005, now abandoned.

(51) Int. Cl.
| | |
|---|---|
| *H03G 3/20* | (2006.01) |
| *H04B 15/00* | (2006.01) |
| *H04R 3/02* | (2006.01) |
| *H03G 9/00* | (2006.01) |
| *H03G 3/00* | (2006.01) |
| *H04R 25/00* | (2006.01) |
| *G10L 21/02* | (2013.01) |

(Continued)

(52) U.S. Cl.
CPC *G10L 21/02* (2013.01); *H03G 3/32* (2013.01); *H03G 7/002* (2013.01)
USPC .......... 381/57; 381/94.7; 381/73.1; 381/102; 381/108; 381/317

(58) Field of Classification Search
CPC .... H04R 1/1083; H04R 25/50; H04R 25/505; H04R 25/356; H04R 29/00; H04R 29/001; H04R 2225/41; H04R 2460/01; H04S 7/306; H03G 7/002; H03G 9/02; H03G 9/025; G10K 11/175; G10K 2210/1081; G10K 2210/3014; G10L 21/02; G10L 21/0208; G10L 21/0264
USPC ........ 381/56–57, 71.1, 71.6, 94.1–94.3, 94.7, 381/94.9, 93, 98, 101–104, 106–109, 312, 381/317, 318, 320, 73.1; 704/200.1, 226; 380/252

See application file for complete search history.

(56) References Cited

U.S. PATENT DOCUMENTS

| | | |
|---|---|---|
| 4,054,849 A | 10/1977 | Yamada |
| 4,061,875 A | 12/1977 | Freifeld et al. |

(Continued)

FOREIGN PATENT DOCUMENTS

| | | |
|---|---|---|
| CN | 1289500 A | 3/2001 |
| EP | 0661858 | 7/1995 |

(Continued)

OTHER PUBLICATIONS

Partial International Search Report and Written Opinion dated Oct. 22, 2010 for Int. Appl. No. PCT/US2009/066321.

(Continued)

*Primary Examiner* — Davetta W Goins
*Assistant Examiner* — Daniel Sellers (57) ABSTRACT

Ambient sound is masked by receiving an audio signal, monitoring an acoustic signal that includes components of both the ambient sound the audio signal, determining a sound level sufficient to at least partially mask the ambient sound, and reproducing the received audio signal to produce an output acoustic signal at the determined sound level.

23 Claims, 5 Drawing Sheets

(51) Int. Cl.
*H03G 3/32* (2006.01)
*H03G 7/00* (2006.01)

(56) References Cited

U.S. PATENT DOCUMENTS

| | | | |
|---|---|---|---|
| 4,123,711 A | 10/1978 | Chow | |
| 4,455,675 A | 6/1984 | Bose et al. | |
| 4,494,074 A | 1/1985 | Bose | |
| 4,641,344 A | 2/1987 | Kasai et al. | |
| 4,868,881 A * | 9/1989 | Zwicker et al. | 381/107 |
| 4,891,605 A | 1/1990 | Tirkel | |
| 4,944,018 A | 7/1990 | Bose et al. | |
| 4,985,925 A | 1/1991 | Langberg et al. | |
| 5,034,984 A | 7/1991 | Bose | |
| 5,208,866 A | 5/1993 | Kato et al. | |
| 5,388,185 A | 2/1995 | Terry et al. | |
| 5,434,922 A | 7/1995 | Miller et al. | |
| 5,615,270 A | 3/1997 | Miller et al. | |
| 5,666,426 A | 9/1997 | Helms | |
| 5,682,463 A | 10/1997 | Allen et al. | |
| 5,832,444 A | 11/1998 | Schmidt | |
| 5,907,622 A | 5/1999 | Dougherty | |
| 6,072,885 A | 6/2000 | Stockham, Jr. et al. | |
| 6,236,731 B1 | 5/2001 | Brennan et al. | |
| 7,050,966 B2 | 5/2006 | Schneider et al. | |
| 7,317,802 B2 | 1/2008 | Wurtz | |
| 7,599,507 B2 * | 10/2009 | Hansen | 381/317 |
| 2002/0086072 A1 | 7/2002 | Allen et al. | |
| 2003/0002659 A1 | 1/2003 | Erell | |
| 2003/0064746 A1 | 4/2003 | Rader et al. | |
| 2003/0118197 A1 | 6/2003 | Nagayasu et al. | |
| 2003/0198357 A1 * | 10/2003 | Schneider et al. | 381/94.2 |
| 2005/0175194 A1 | 8/2005 | Anderson | |
| 2005/0226444 A1 | 10/2005 | Coats | |
| 2006/0126865 A1 | 6/2006 | Blamey et al. | |
| 2006/0251261 A1 | 11/2006 | Christoph | |
| 2006/0262938 A1 | 11/2006 | Gauger et al. | |
| 2008/0181422 A1 | 7/2008 | Christoph | |
| 2010/0158263 A1 | 6/2010 | Katzer et al. | |
| 2010/0202631 A1 | 8/2010 | Short | |

FOREIGN PATENT DOCUMENTS

| | | | |
|---|---|---|---|
| EP | 1003154 | A2 | 5/2000 |
| EP | 1720249 | A1 | 11/2006 |
| WO | 9847315 | A1 | 10/1998 |
| WO | 9922366 | A2 | 5/1999 |
| WO | 0019686 | | 4/2000 |
| WO | 00/30264 | A1 | 5/2000 |
| WO | 0139370 | A2 | 5/2001 |
| WO | 01/45082 | A1 | 6/2001 |
| WO | 2005011111 | | 2/2005 |
| WO | 2006125061 | A1 | 11/2006 |
| WO | 2007113487 | A1 | 10/2007 |

OTHER PUBLICATIONS

Notice of Invitation to Pay Additional Fees dated Apr. 6, 2010 in PCT/US2010/021571.
M3500 Bluetooth Headset, Plantronics, Digitally Enhanced Voice with Audio IQ Technology, Printed Feb. 6, 2004 PS533.
JP Office Action dated Oct. 4, 2011 for JP Appl. No. 2008512496.
Invitation to Pay Additional Fees dated Oct. 10, 2010 for PCT/US2009/066321.
International Search Report dated Feb. 21, 2011 for PCT/US2009/066321.
International Search Report and Written Opinion dated Sep. 17, 2010 for Int. Appln. No. PCT/US2010/021571.
International Search Report and Written Opinion dated Oct. 4, 2006 for PCT/US2006/019193.
International Preliminary Report on Patentability dated Nov. 29, 2007 for PCT/US2006/019193.
Hanagami, Nathan Fox. "Adding DSP Enhancement to the BOSE Noise Canceling Headphones", Mather Thesis. Massachusetts Institute of Technology, May 18, 2005.
EP Office Action dated Aug. 20, 2008 in counterpart EP 06760069.2.
Dan Race, New Plantronics Bluetooth Headset Delivers Breakthrough Sound Quality on Both Ends of the Conversion, Las Vegas, NV, International CES, Jan. 8, 2004, http//www.plantronics.com/north_america/en_US/press/release/index.jhtml?id=pr_20040108_002 . . . , downloaded Dec. 19, 2005.
CN Office Action dated Oct. 20, 2010 for CN Appl. No. 200680023332.5.
CN Office Action dated Jul. 12, 2011 for CN Appln. No. 200680023332.5.
CN Office Action dated Nov. 8, 2011 for CN Appln. No. 200680023332.5.
Chinese Office Action for Application No. 200980150864.9 dated Jul. 16, 2012.
Chinese Fourth Office Action Dated Jul. 3, 2012 for Application No. 200680023332.5.

* cited by examiner

ADAPTED AUDIO MASKING

CLAIM OF PRIORITY

This application is a continuation-in-part of and claims priority to U.S. patent application Ser. No. 11/131,913, filed May 18, 2005, which is incorporated here by reference in its entirety.

BACKGROUND

This invention relates to adaptation of an audio response based on noise or other interfering ambient signals.

When one listens to music, voice, or other audio over headphones, one is often seeking a private experience. Using the headphones presents the audio in a fashion that does not disturb others in one's vicinity and hopefully prevents sounds in one's environment (i.e., ambient noise such as conversation, background noise from airplanes or trains, etc.) from interfering with one's enjoyment of the audio. Listening to the appropriate audio can also prevent such environmental sounds from intruding into or distracting from one's train of thought, creating a sense of privacy or focus on task. However, if the audio one wishes to listen to is too loud or too dynamic, it can in and of itself become a distraction. One can manually try to find the right audio level to just hide or mask environmental sound while still being quiet enough to just stay in the background of one's attention, but if the ambient environment is dynamic—as is likely—the need to re-adjust becomes a distraction.

In situations in which one wishes to use the music as a background to cognitive activities, the user may adjust the volume so that the input music or other signal masks distractions present in the ambient noise while not intruding too much onto one's attention.

Approaches to adapting a speech signal for presentation in the presence of noise have made use of compression with the goal of achieving good intelligibility for the speech. Such compression can also reduce the propensity for dynamics in the audio to attract one's attention away from a cognitive task.

SUMMARY

In general, in one aspect, masking ambient sound includes receiving an audio signal, monitoring an acoustic signal that includes components of both the ambient sound and the audio signal, determining a sound level sufficient to at least partially mask the ambient sound, amplifying the received audio signal to a level sufficient to produce an output acoustic signal at the determined sound level, and reproducing the amplified audio signal with an electroacoustic transducer.

Implementations may include one or more of the following. Monitoring the acoustic signal may include receiving a signal from a microphone inside an earpiece of a set of headphones. The sound level may be determined to maintain the Speech Transmission Index (STI) of the acoustic signal with respect to the ambient sound at a threshold. Determining the sound level may include passing a comparison signal through a first band pass filter and a first envelope detector, passing the monitored acoustic signal through a second band pass filter and a second envelope detector, comparing outputs of the first and second envelope detectors, and setting the gain of a variable gain element to control the correlation between the outputs of the first and second envelope detectors. The comparison signal may include the audio signal. The comparison signal may include a signal from a microphone on the outside of an earpiece of the set of headphones. The first and second band pass filters may pass frequencies between about 1 kHz and about 3 kHz. The first and second envelope detectors may average input signal energy over a time constant of about 10 ms. The controlled correlation may be computed over a period of about 10 ms. The first band pass filter may include a first plurality of band pass filters having different pass bands, the second band pass filter may include a second plurality of band pass filters having the same pass bands as the first plurality of band pass filters, the first envelope detector and the second envelope detector each may include a plurality of envelope detectors corresponding to the first and second pluralities of band pass filters.

Comparing the outputs of the first and second envelope detectors may include providing the outputs of the envelope detectors to a correlator to compute a correlation between the outputs of the first and second envelope detectors, and setting the gain of the variable gain element may include subtracting the correlation from a target correlation, and increasing or decreasing the gain proportionally to a smoothed representation of the result of the subtraction. The comparison signal may include the amplified audio signal, and setting the gain of the variable gain element may include increasing the gain when the smoothed representation of the result of the subtraction may be positive. The comparison signal may include a signal from a microphone on the outside of an earpiece of the set of headphones, and setting the gain of the variable gain element may include increasing the gain when the smoothed representation of the result of the subtraction may be negative.

The target correlation may correspond to a Speech Transmission Index (STI) of the acoustic signal relative to the ambient noise of less than 0.2. Obtaining smoothed representation of the result of the subtraction by integrating the results of the subtraction over a period of time. Providing signals to the band pass filters, envelope detectors, and correlator may include executing processing routines within a digital signal processor. The sound level sufficient to at least partially mask the ambient sound may be about 10 dB SPL greater than the ambient sound. Reproducing the received audio signal may include setting the gain of a variable gain element to amplify the received audio signal to a level sufficient to cause an electroacoustic transducer to produce the output acoustic signal at the determined sound level. Determining a second sound level greater than the sound level sufficient to at least partially mask the ambient sound, and compressing the audio signal such that the output acoustic signal may be between the sound level sufficient to at least partially mask the ambient sound and the second sound level. Receiving the audio signal may include generating the audio signal.

In general, in some aspects, an audio reproduction system includes a first microphone input inside an earpiece of a set of headphones, an variable gain amplifier having an input for receiving an audio signal and an output, an electroacoustic transducer coupled to the output of the amplifier, a first band pass filter coupled to the microphone input, a first envelope detector coupled to an output of the first band pass filter, a second band pass filter coupled to a source of a comparison signal, a second envelope detector coupled to an output of the second band pass filter, and a correlator coupled to outputs of the first and second envelope detectors to output a value of a correlation between the outputs of the first and second envelope detectors, the gain of the variable gain amplifier is influenced by a difference between an output of the correlator and a target correlation value. The band pass filters, envelope detectors, and correlator may include processing routines within a digital signal processor. The source of the comparison signal may include the output of the amplifier. The source of the comparison signal may include a second microphone input from a microphone on the outside of the earpiece of the set of headphones.

Other features and advantages of the invention are apparent from the following description, and from the claims.

DESCRIPTION

Figure 1:
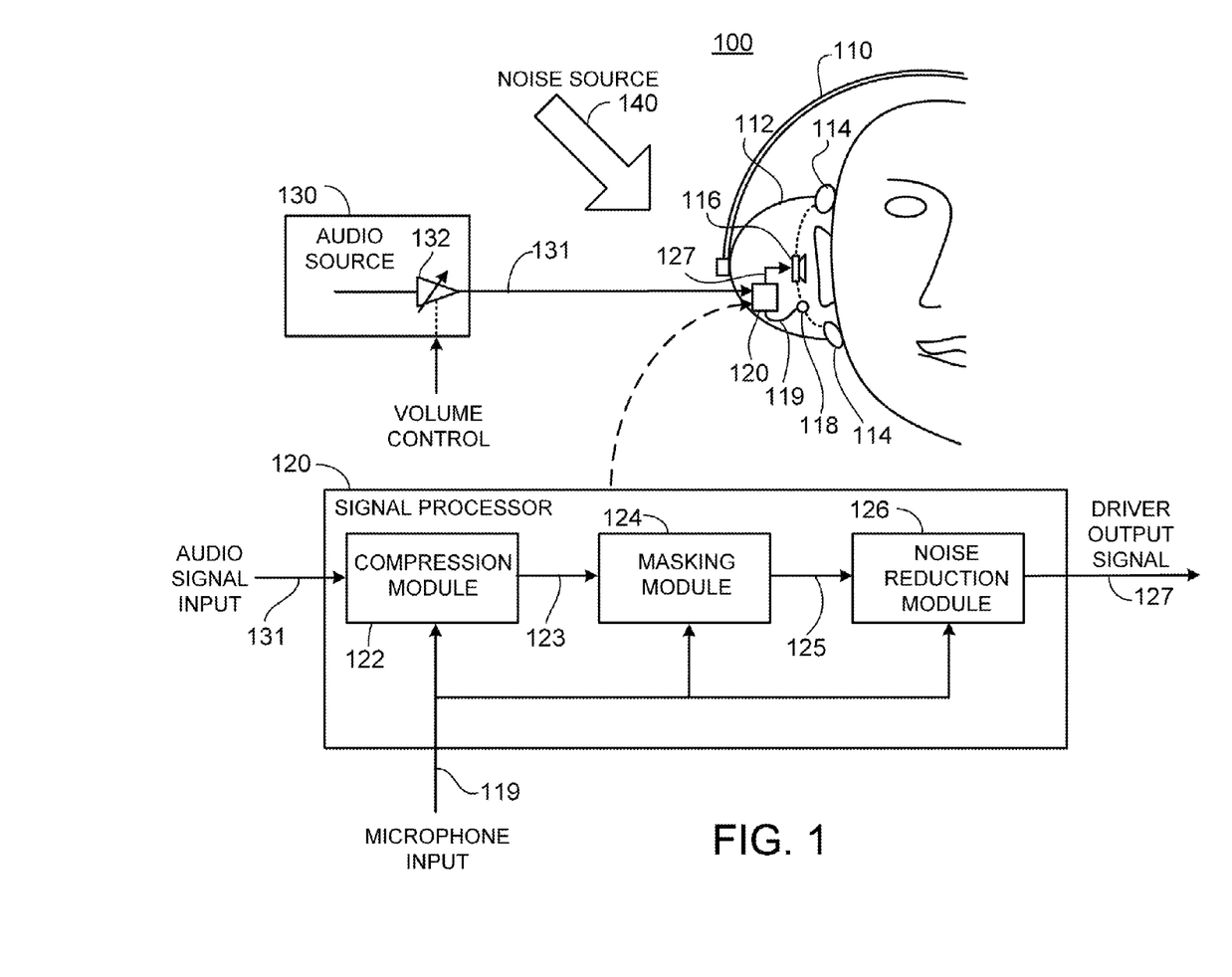
FIGS. 1 and 4 are overall block diagrams of headphone audio systems.

System Overview (FIG. 1)

Referring to FIG. 1, an audio system 100 includes a headphone unit 110 worn by a user. The headphone unit receives an audio signal input 131 from an audio source 130. The audio source 130 includes a volume control 132 that can be adjusted by the user. The user listens to an acoustic realization of the audio signal input that is generated within the earpiece.

In general, a noise source 140, such as a source of mechanical noise, people conversing in the background, etc., generates ambient acoustic noise. The ambient acoustic noise is attenuated by the physical design of the headphone unit 110 (e.g., through the design of earpiece 112 and ear pad 114) and optionally using an active noise reduction system embedded in the headphone unit. The audio signal input 131 is processed in the headphone unit in a signal processor 120 and a driver output signal 127 is passed from the signal processor 120 to a driver 116, which produces the acoustic realization of the audio signal input. The user perceives this acoustic realization in the presence of an interfering signal, specifically in the presence of the attenuated ambient noise. The signal processor may alternatively be located external to earpiece 112.

A number of transformations of the audio signal input 131 that are performed by the signal processor 120 are based on psychoacoustic principles. These principles include masking effects, such as masking of a desired audio signal by residual ambient noise or masking of residual ambient noise by an audio signal that is being presented through the headphones. Another principle relates to a degree of intelligibility of speech, such as distracting conversation, that is presented in conjunction with a desired signal, such as an audio signal being presented through the headphones. In various configurations and parameter settings, the headphone unit adjusts the audio level and/or compression of a desired audio signal to mitigate the effect of masking by ambient noise and/or adjusts the level of a desired signal to mask ambient noise or to make ambient conversation less distracting. In some versions, the user can select between a number of different settings, for example, to choose between a mode in which the headphones mitigate ambient noise and a mode that makes ambient conversation less distracting.

The signal processor 120 makes use of an input from a microphone 118 that monitors the sound (e.g., sound pressure level) inside the earpiece that is actually presented to the user's ear. This microphone input therefore includes components of both the acoustic realization of the audio signal input and the attenuated (or residual) ambient noise.

The signal processor 120 performs a series of transformations on the audio signal input 131. A compression module 122 performs a level compression based on the noise level so that quiet audio passages are better perceived by the user. A masking module 124 performs gain control and/or level compression based on the noise level so the ambient noise is less easily perceived by the user. A noise reduction module performs an active noise reduction based on a monitored sound level inside the earpiece. In alternative versions of the system, only a subset of these modules is used and/or is selectively enabled or disabled by the user.

Figure 2:
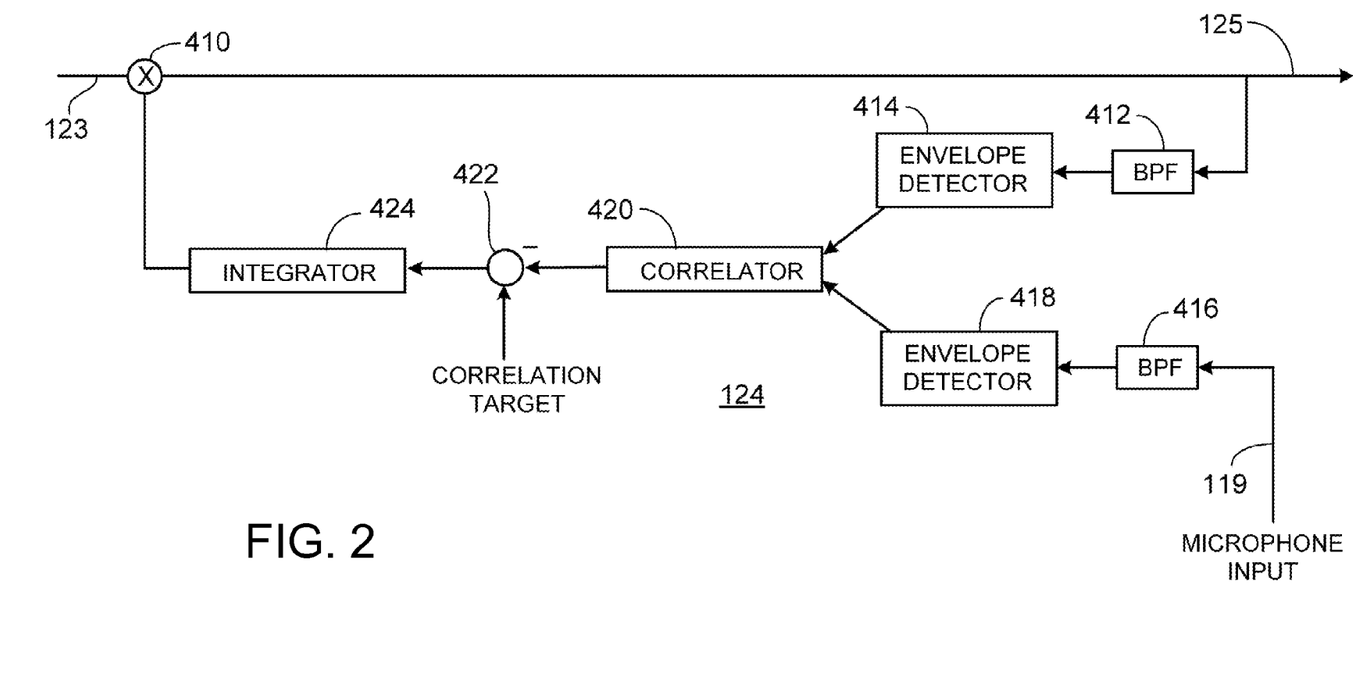
FIGS. 2 and 5 are block diagrams of masking modules.

Auto-Masking (FIG. 2)

The masking module 124 automatically adjusts the audio level to reduce or eliminate distraction or other interference to the user from signal the residual ambient noise in the earpiece. Such distraction is most commonly caused by the conversation of nearby people, though other sounds can also distract the user, for example while the user is performing a cognitive task. The masking module uses audio to provide additional isolation over the active or passive attenuation provided by the headphones.

One approach to reducing or eliminating the distraction is to adjust the audio level to be sufficiently loud to completely mask the residual ambient noise at all times. The masking module 124 achieves a reduction or elimination of the distraction without requiring as loud a level. Generally, the masking module 124 automatically determines an audio level to provide partial masking of the residual noise that is sufficient to prevent the noise (e.g., conversation) from intruding on the user's attention. This approach to removing distraction can be effective if the user has selected audio to listen to which is inherently less distracting and to the user's liking for the task at hand. Examples of such selected audio can be a steady noise (such as the masking noise sometimes used to obscure conversation in open-plan offices), pleasant natural sounds (such as recordings of a rainstorm or the sounds near a forest stream), or quiet instrumental music.

A simple quantitative example can illustrate how beneficial this type of masking approach can be. Suppose the user is working in an open-plan office with a background noise level of 60 dB SPL resulting from the conversation of one's neighbors. If a headphone that provides 20 dB noise reduction is donned, the resulting residual noise level of the distracting conversation at the ear is 60 dB minus 20 dB, or 40 dB SPL. Although attenuated, this residual noise level can be loud enough for a person with normal hearing to easily understand words and thus potentially be distracted. However, assuming that an SNR of −10 dB (i.e., the ratio of residual unattenuated conversation "signal" level to audio input masking "noise" level) provides sufficient partial masking so as to make the surrounding conversation unintelligible (or at least not attention grabbing), then the user can listen to audio of the user's choice at a level of 50 dB SPL and obscure the distracting conversation. Thus, when wearing such a system the user is immersed in 50 dB SPL audio that the user prefers to work by, as opposed to the 60 dB SPL (i.e., 10 dB louder) background conversation that may have distracted the user.

The masking module 124 adjusts the level of the audio signal input so that it is only as loud as needed to mask the residual noise. Generally, in the example above, if the ambient noise level was 55 dB rather than 60 dB SPL, then the audio signal would be presented to the user at a level of 45 dB rather than 50 dB SPL.

The masking module 124 adjusts a gain applied to a signal multiplier 410 in a feedback arrangement based on the resulting microphone input 119. In general, the amount of gain determined by the module is based on the psychoacoustic principles that aim to relate the degree of intelligibility of speech signals in the face of interfering signals such as noise and reverberation. One objective predictor of such intelligibility is the Speech Transmission Index, which is an estimate of intelligibility based on a degree to which the modulations of energy in speech (i.e., the energy envelope) is preserved between a desired signal and the signal presented to the user. While the STI as defined in standards is the result of a computation combining modulation transfer functions at multiple speech and modulation frequencies, it can be approximated by using fewer, or even one audio frequency band and the time-varying correlation of the level within those bands between the signal heard and an interfering signal.

Referring to FIG. 2, the masking module 124 determines energy envelopes associated with each of the microphone input 119 and the audio signal 125 after the gain adjustment (at multiplier 410). The masking module 124 determines the amount of gain to apply based on the relationship between these energy envelopes. The gain is adjusted in a feedback arrangement to maintain a desired relationship between the energy envelopes.

The audio signal 125 and the microphone input 119 are passed to band-pass filters 412 and 416, respectively. The pass bands of these filters are 1 kHz-3 kHz, which is a band within which speech energy contributes significantly to intelligibility. The filtered audio signal and microphone input are passed to envelope detectors 414 and 418, respectively. The envelope detectors perform a short-time averaging of the signal energy (i.e., squared amplitude) over a time constant of approximately 10 ms, which captures speech modulations at rates of up to approximately 15 Hz.

The outputs of the two envelope detectors 414 and 418 are input to a correlator 420, which provides an output based on a past block length, which in this version of the system is chosen to be of duration 200 ms. The correlator normalizes the two inputs to have the same average level over the block length then computes the sum of the product of those recent normalized envelope values. In general, if the correlation is high, then the microphone input largely results from the audio input, which means there is relatively little residual noise (distracting conversation) present. If the correlation is low, the microphone input largely results from the residual noise and the input audio is not loud enough to obscure it.

The output of the correlator 420 is subtracted at an adder 422 from a correlation target value. This value is set based on a value determined experimentally to provide sufficient masking of distracting speech. A typical value for the correlation target is 0.7 or as high as 0.9. Other values may be chosen based on experimentation, for example, using a full STI calculation in a laboratory environment to select a value that is then hard-coded in the product. Optionally, the user can adjust the correlation target value based on the user's preference, the specific nature of the ambient noise, etc.

The output of the adder 422 is passed to an integrator 424. The integrator responds to a constant difference between the measured correlation and the target with a steadily increasing (or decreasing, depending on the sign of the difference) gain command. The gain command output of the integrator 424 is applied to a multiplier 410, which adjusts the gain of the audio signal input. The integrator time constant is chosen to establish a subjectively preferred rate at which the audio gain controlling feedback loop shown in FIG. 2 responds to changes in distracting conversation level. A response time of five to ten seconds is appropriate. Alternative responses may be used in place of integrator 424. For example, a low-pass filter with high gain at DC may be used to regulate the output of correlator 420 to be sufficiently close to the target value as to achieve the desired level of masking.

Alternatives

To prevent dynamics in music used as masking audio from intruding too much into one's attention (e.g., when it is desired for the music to remain a pleasant background to cognitive tasks) it may be desirable to compress input audio 123 prior to the level adjustment provided by the masking system of FIG. 2. A standard compressor structure with compression ratio of 2:1 to 3:1 can be appropriate, though some users may prefer other ratios, or perhaps no compression. The choice of type of compression used can be made user selectable.

Variations on the approach shown in FIG. 2 are possible. Left and right earpiece microphone and audio signals can be acted on separately or combined and the monaural component processed to determine the gain to apply to the audio. Multiple BPF pass-bands could be set and the envelope detection and correlation done in parallel on the different bands, with the resulting correlation factors combined in a weighted fashion prior to comparison with a target. If random or natural sounds are desired as the masking signal rather than music, these could be stored in some compressed form in the system so that auto-masking can be accomplished without the need to connect to an audio source.

The embodiment described above determines the audio and microphone envelopes (time-varying levels) from an energy calculation by low-pass filtering with 10 ms time constant the square of the filtered signal level. Alternatively, the absolute value of the filter output can be low-pass filtered to determine an envelope. Also, other low-pass filter time constants than 10 ms may be used.

Other correlation block lengths than 200 ms may be used. Alternatively, the correlation may use a non-rectangular (weighted) window.

The embodiment above adjusts the volume level of the audio to maintain a target correlation value between the band-limited signal envelopes of the audio input and monitored microphone signal. Alternatively, the auto-masking system could be designed to adjust the volume level to maintain a target SNSR or SNR value. Alternatively, the auto-masking system could be designed to adjust the volume level to maintain a target ratio of the level of the acoustic signal to the audio signal (adjusted for the sensitivity of the headphone to audio input).

The embodiment described above implements the auto-masking system for use with headphones. Alternatively, auto-masking could be implemented in other situations, for example in situations that are characterized by an approximately known time delay for propagation of output audio signal 125, through an acoustic environment, to microphone signal 119 and an acoustic environment that is largely absent of reverberation. Under such conditions auto-masking could be made to operate advantageously in a small room.

Figure 3:
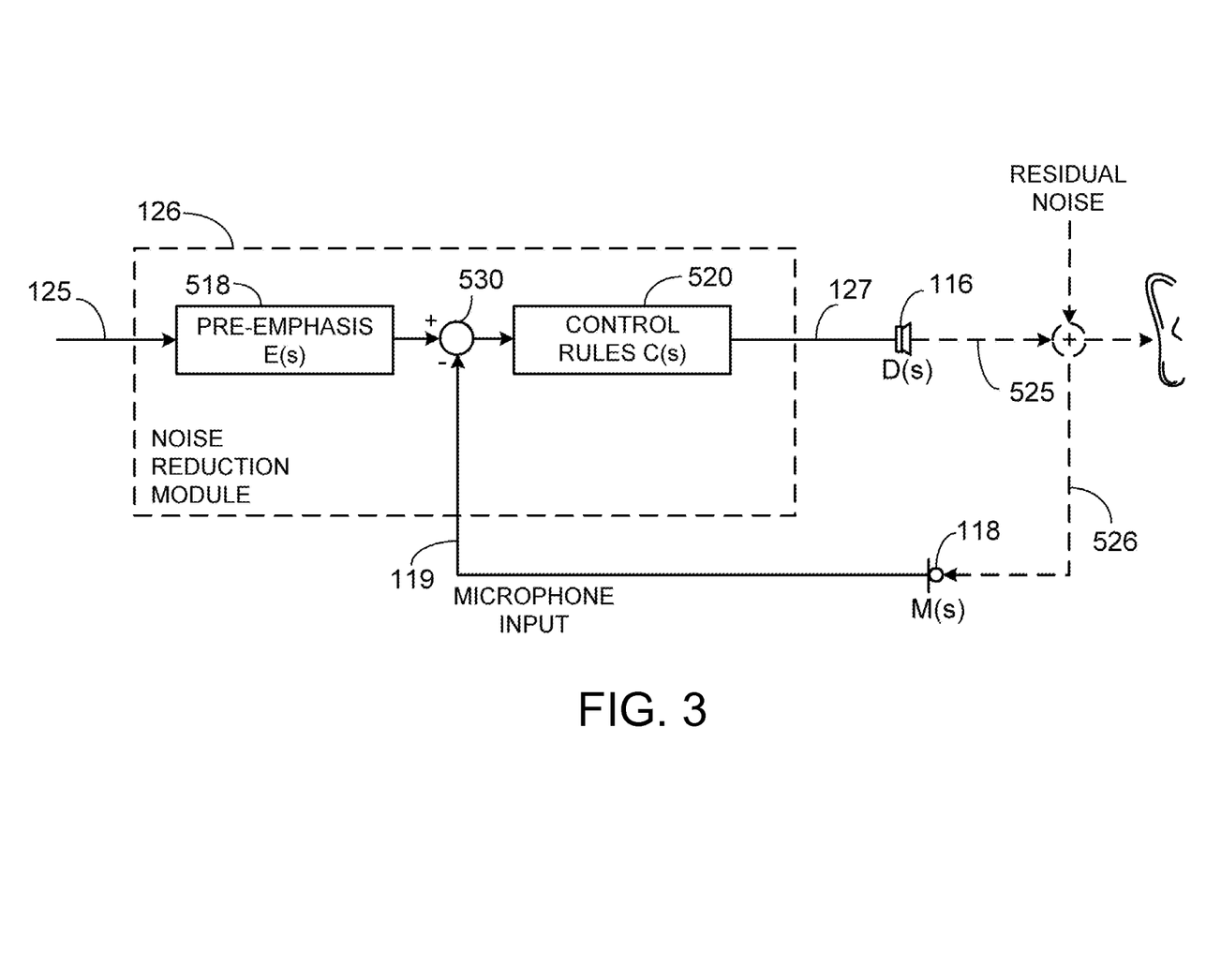
FIG. 3 is a block diagram of a noise reduction module.

Noise Reduction (FIG. 3)

The noise reduction module 126 is applied to the audio signal 125, which has already been subject to gain control and/or compression. Referring to FIG. 3, the noise canceller makes use of a negative feedback arrangement in which the microphone input 119 is fed back and compared to a desired audio signal, and the difference is fed forward to the audio driver. This arrangement is similar to that taught in U.S. Pat. No. 4,455,675, issued to Bose and Carter, which is incorporated herein by reference. In FIG. 3, the feedback loop includes control rules 520, which provide gain and frequency-dependent transfer function to be applied to the electrical signal. The output 127 of the control rules 520 is applied to the driver 116 in the earpiece. The driver has a frequency-dependent transfer function D between its electrical input 127 and the sound pressure 525 achieved in the earpiece. The microphone 118 senses the sound pressure and produces the electrical microphone input 119. The microphone has a transfer function M between the sound pressure 526 and the resulting electrical microphone signal 119. A preemphasis component 518 receives the output 125 from the masking module 124 and passes its output to the feedback loop. The preemphasis component 518 compensates for non-uniform frequency response characteristics introduced by the feedback loop.

Based on this arrangement, the audio signal applied to the noise canceller has an overall transfer function of $$\left(\frac{ECD}{1+CMD}\right)$$

while the ambient noise has a transfer function $$\left(\frac{1}{1+CMD}\right)$$

thereby attenuating the ambient noise beyond that which is achieved by the physical characteristics of the earpiece.

Feed-Forward Variation

Figure 4:
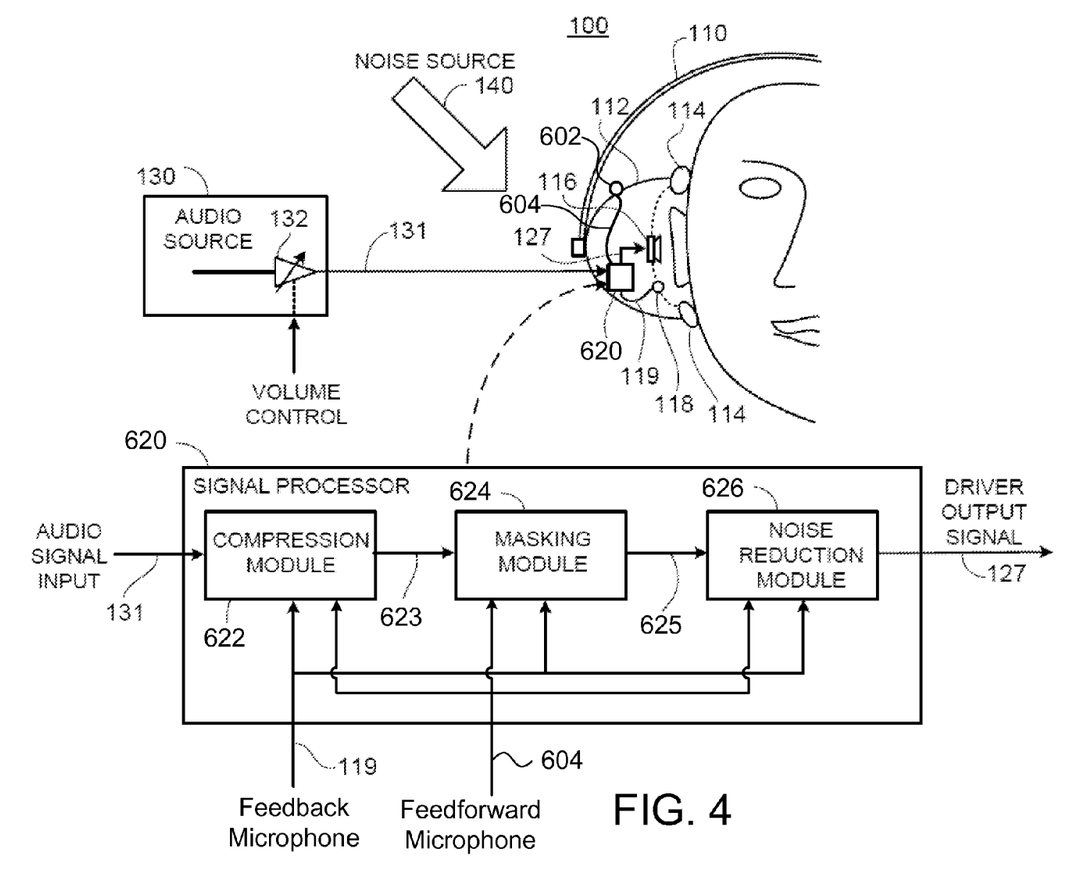

In some examples, as shown in FIG. 4, a headset includes both a feedback microphone 118 located inside the earpiece, as described above, and a feedforward microphone 602 located outside the earpiece. These may be used cooperatively to improve active noise reduction, as embodied in the QuietComfort® 15 Acoustic Noise Cancelling® headphones from Bose Corporation in Framingham, Mass. The feedforward and feedback microphones can also be used cooperatively to improve adaptive masking.

As shown in FIG. 4, an improved signal processor 620 provides a feedforward microphone input 604 to a compression module 622, masking module 624, and noise reduction module 626. The output 623 from the compression module is again provided to the masking module, and the output 625 of the masking module is again provided to the noise reduction module, as in the example of FIG. 1 which had only feedback.

Figure 5:
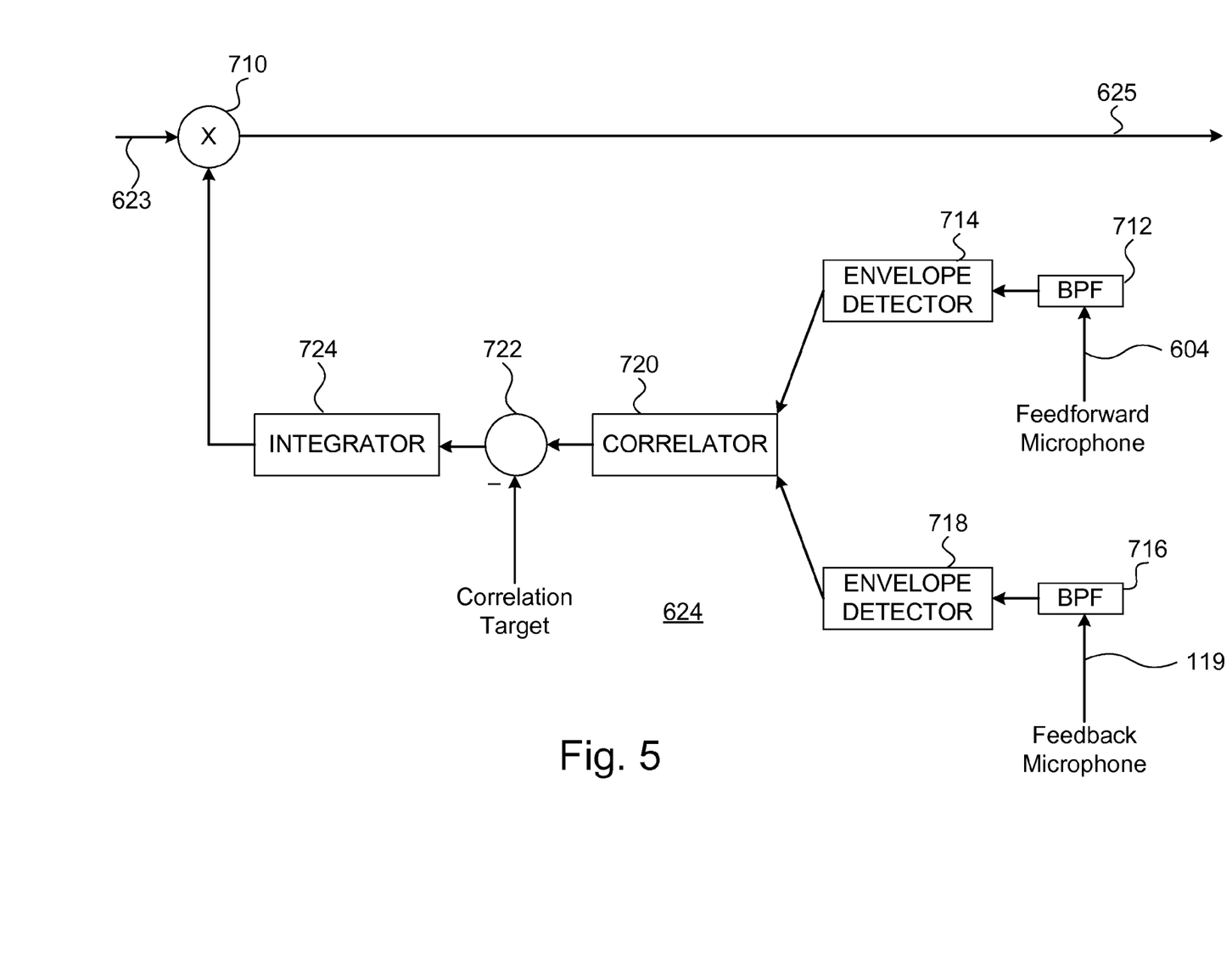

The feedforward/feedback masking module 624 is shown in FIG. 5. The masking module 624 is similar to the masking module 124 shown in FIG. 4 and described above but instead of feeding the masking module's output back into a band-pass filter and envelope detector, the feedforward microphone input 604 is provided to a band pass filter 712, and the filtered signal is provided to an envelope detector 714. As before, the feedback input 119 is provided to a band pass filter 716 and envelope detector 718, and the outputs of the envelope detectors are provided to a correlator 720 that computes the correlation between the feedforward and feedback envelopes. It should be noted that the correlator uses some number of recent values from the envelope detectors, so that the value output remains current. It may be the same time frame as the correlators, on the order of 5 to 10 ms, or it may be a longer or smaller time period. The band pass filters 712, 716, envelope detectors 714, 718, and correlator 720 may be the same as in the feedback-only example, or they may have different parameters. A target value is subtracted from the output of the correlator at an adder 722 and the difference is passed to an integrator 724. Note that this is different from the feedback-only example of FIG. 2, where the correlator output was subtracted from the target. A multiplier 710 adjusts the gain based on the output of the integrator 724. The integrator time constant is selected as in the feedback-only case.

The change in sign at the adder 722, compared to FIG. 2, reverses the behavior of the system from that of the feedback-only case. In the feedback-only case, gain was increased if the correlation was below a target, as that would indicate that the output signal 125 did not match the feedback signal 119, so undesired sound was still getting through, and more masking was needed. When correlation was high, the sound produced matched the feedback signal, so only that masking sound was being detected. If above the target, it meant that the masking sound was larger than it needed to be and gain could be decreased. When feedforward and feedback signals, i.e., signals outside the earpiece and signals inside the earpiece, are being compared, and masking the outside sounds is the goal, the magnitude of the correlation should be low, as that indicates that the sound being heard inside the earpiece is different from the sound outside the earpiece. The correlation target is not simply set to zero, as that could lead to increasing the gain to its limit (the sound would be masked, but the masking sound would be too loud). Instead, a specific, non-zero correlation is selected that provides the right amount of masking without leading to excessive volume in the masking signal. If the correlation is above the target, the sum at the adder 722 is positive, so gain is increased, but if the correlation is below the target, indicating that more masking is being provided than is needed, the sum is negative and the gain is decreased. It should be noted that it is actually the magnitude of the correlation that is compared to the target—negative correlation values, which could result from the random nature of the sounds involved, are treated as positive values to be subtracted from the target.

Implementation

The approaches described above are implemented using analog circuitry, digital circuitry or a combination of the two. Digital circuitry can include a digital signal processor that implements one or more of the signal processing steps described above. In the case of an implementation using digital signal processing, additional steps of anti-alias filtering and digitization and digital-to-analog conversion are not shown in the diagrams or discussed above, but are applied in a conventional manner. The analog circuitry can include elements such as discrete components, integrated circuits such as operational amplifiers, or large-scale analog integrated circuits.

The signal processor can be integrated into the headphone unit, or alternatively, all or part of the processing described above is housed in separate units, or housed in conjunction with the audio source. An audio source for noise masking can be integrated into the headphone unit thereby avoiding the need to provide an external audio source.

In implementations that make use of programmable processors, such as digital signal processors or general purpose microprocessor, the system includes a storage, such as a non-volatile semiconductor memory (e.g., "flash" memory) that holds instructions that when executed on the processor implement one or more of the modules of the system. In implementations in which an audio source is integrated with the headphone unit, such storage may also hold a digitized version of the audio signal input, or may hold instructions for synthesizing such an audio signal. We refer to reading an audio file from storage or synthesizing such a signal interchangeably as "generating" the signal.

Alternatives

The discussion above concentrates on processing of a single channel. For stereo processing (i.e., two channels, one associated with each ear), one approach is to use a separate instance of signal processors for each ear/channel. Alternatively, some or all of the processing is shared for the two channels. For example, the audio inputs and microphone inputs may be summed for the two channels and a common gain is then applied to both the right and the left audio inputs. Some of the processing steps may be shared between the channels while others are done separately. In the present embodiment the compression and masking stages are performed on a monaural channel while the active noise reduction is performed separately for each channel.

Although aspects of the system are described above in the context of driving headphones, the approaches can be applied in other environments. Preferably, such other environments are ones in which (a) the microphone can sense what is being heard at the ear of users, (b) time delays in propagation of audio from speakers to the microphone are small compared to envelope detector time constants and (c) there is little reverberation. Examples of other applications besides headphones where the approaches can be applied are telephones (fixed or mobile), automobiles or aircraft cockpits, hearing aids, and small rooms.

It is to be understood that the foregoing description is intended to illustrate and not to limit the scope of the invention, which is defined by the scope of the appended claims. Other embodiments are within the scope of the following claims.

What is claimed is:

1. A method for masking ambient sound, comprising:
   receiving an audio signal;
   monitoring an acoustic signal that includes components of both the ambient sound and the audio signal;
   determining a sound level sufficient to at least partially mask the ambient sound by:
      passing the monitored acoustic signal through a second band pass filter and a second envelope detector,
      passing a comparison signal through a first band pass filter and a first envelope detector,
      comparing outputs of the first and second envelope detectors, and
      setting the gain of a variable gain element to control the correlation between the outputs of the first and second envelope detectors;
   amplifying the received audio signal to a level sufficient to produce an output acoustic signal at the determined sound level; and
   reproducing the amplified audio signal with an electroacoustic transducer.

2. The method of claim 1 wherein:
   monitoring the acoustic signal comprises receiving a signal from a microphone inside an earpiece of a set of headphones.

3. The method of claim 2 wherein the sound level is determined to maintain the Speech Transmission Index (STI) of the acoustic signal with respect to the ambient sound at less than a threshold.

4. The method of claim 1 wherein the comparison signal comprises the amplified audio signal.

5. The method of claim 1 wherein the comparison signal comprises a signal from a microphone on the outside of an earpiece of the set of headphones.

6. The method of claim 1 wherein the first and second band pass filters pass frequencies between about 1 kHz and about 3 kHz.

7. The method of claim 1 wherein the first and second envelope detectors average input signal energy over a time constant of about 10 ms.

8. The method of claim 1 wherein the controlled correlation is computed over a period of about 10 ms.

9. The method of claim 1 wherein:
   the first band pass filter comprises a first plurality of band pass filters having different pass bands,
   the second band pass filter comprises a second plurality of band pass filters having the same pass bands as the first plurality of band pass filters,
   the first envelope detector and the second envelope detector each comprise a plurality of envelope detectors corresponding to the first and second pluralities of band pass filters.

10. The method of claim 1 wherein:
    comparing the outputs of the first and second envelope detectors comprises providing the outputs of the envelope detectors to a correlator to compute a correlation between the outputs of the first and second envelope detectors, and
    setting the gain of the variable gain element comprises subtracting the correlation from a target correlation, and increasing or decreasing the gain proportionally to a smoothed representation of the result of the subtraction.

11. The method of claim 10 wherein the comparison signal comprises the amplified audio signal, and
    setting the gain of the variable gain element comprises increasing the gain when the smoothed representation of the result of the subtraction is positive.

12. The method of claim 10 wherein the comparison signal comprises a signal from a microphone on the outside of an earpiece of the set of headphones, and
    setting the gain of the variable gain element comprises increasing the gain when the smoothed representation of the result of the subtraction is negative.

13. The method of claim 10 wherein the target correlation corresponds to a Speech Transmission Index (STI) of the acoustic signal relative to the ambient noise of less than 0.2.

14. The method of claim 10 further comprising obtaining smoothed representation of the result of the subtraction by integrating the results of the subtraction over a period of time.

15. The method of claim 13 wherein providing signals to the band pass filters, envelope detectors, and correlator comprises executing processing routines within a digital signal processor.

16. The method of claim 1 wherein:
    the sound level sufficient to at least partially mask the ambient sound is about 10 dB SPL greater than the ambient sound.

17. The method of claim 1 wherein:
    reproducing the received audio signal comprises setting the gain of a variable gain element to amplify the received audio signal to a level sufficient to cause an electroacoustic transducer to produce the output acoustic signal at the determined sound level.

18. The method of claim 1 wherein the sound level is determined to maximize a ratio of the level of the output acoustic signal to the level of the sum of the ambient sound and the output acoustic signal.

19. The method of claim 1 wherein receiving the audio signal comprises generating the audio signal.

20. An audio reproduction system comprising:
    a first microphone input inside an earpiece of a set of headphones;
    an variable gain amplifier having an input for receiving an audio signal and an output;
    an electroacoustic transducer coupled to the output of the amplifier;
    a first band pass filter coupled to the microphone input;
    a first envelope detector coupled to an output of the first band pass filter;
    a second band pass filter coupled to a source of a comparison signal;

a second envelope detector coupled to an output of the second band pass filter; and a correlator coupled to outputs of the first and second envelope detectors to output a value of a correlation between the outputs of the first and second envelope detectors;

wherein the gain of the variable gain amplifier is influenced by a difference between an output of the correlator and a target correlation value.

21. The system of claim 20 wherein the band pass filters, envelope detectors, and correlator comprise processing routines within a digital signal processor.

22. The system of claim 20 wherein the source of the comparison signal comprises the output of the amplifier.

23. The system of claim 20 wherein the source of the comparison signal comprises a second microphone input from a microphone on the outside of the earpiece of the set of headphones.

* * * * *